United States Patent
Musiol et al.

(10) Patent No.: US 12,283,924 B2
(45) Date of Patent: Apr. 22, 2025

(54) RF POWER AMPLIFIER WITH COMPENSATED CURRENT AND GAIN FROM TURN-ON TO END OF LONG BURST

(71) Applicant: BeRex Inc., Santa Clara, CA (US)

(72) Inventors: Lothar Johannes Maria Musiol, San Clemente, CA (US); Taewon Jung, Seoul (KR)

(73) Assignee: BeRex Inc., Santa Clara, CA (US)

( * ) Notice: Subject to any disclaimer, the term of this patent is extended or adjusted under 35 U.S.C. 154(b) by 668 days.

(21) Appl. No.: 17/518,925

(22) Filed: Nov. 4, 2021

(65) Prior Publication Data

US 2023/0132419 A1 May 4, 2023

(51) Int. Cl.
| | |
|---|---|
| H03G 3/10 | (2006.01) |
| H03F 3/195 | (2006.01) |
| H03F 3/24 | (2006.01) |
| H03G 3/30 | (2006.01) |

(52) U.S. Cl.
CPC ............. *H03F 3/245* (2013.01); *H03F 3/195* (2013.01); *H03G 3/3047* (2013.01); *H03F 2200/447* (2013.01); *H03F 2200/451* (2013.01); *H03G 2201/708* (2013.01)

(58) Field of Classification Search
CPC .... H03F 3/245; H03F 3/195; H03F 2200/447; H03F 2200/451; H03F 2200/294; H03F 3/72; H03F 2203/7206; H03F 2203/7215; H03F 1/223; H03F 1/301; H03F 1/302; H03F 3/04; H03F 2200/18; H03F 1/0261; H03F 3/26; H03F 3/3088; H03G 3/3047; H03G 2201/708; H03G 3/3042
USPC .................................................. 330/285, 296
See application file for complete search history.

(56) References Cited

U.S. PATENT DOCUMENTS

| | | | | |
|---|---|---|---|---|
| 6,414,553 | B1 * | 7/2002 | Luo .......................... | H03F 1/302 330/296 |
| 6,838,932 | B2 * | 1/2005 | Izumiyama ............. | H03F 1/302 330/285 |
| 7,365,604 | B2 * | 4/2008 | Luo .......................... | H03F 1/30 330/296 |
| 11,677,363 | B2 * | 6/2023 | Honda ................... | H03F 1/0216 330/296 |
| 2015/0070096 | A1 * | 3/2015 | Watanabe ............... | H03F 3/195 330/296 |
| 2019/0245492 | A1 | 8/2019 | Rabjohn et al. | |

* cited by examiner

*Primary Examiner* — Khanh V Nguyen
(74) *Attorney, Agent, or Firm* — Eric Karich; Karich & Associates (57) ABSTRACT

Radio frequency (RF) power amplifier architectures and circuits providing compensated current and gain from turn-on to end of long signal burst intervals to counteract amplifier transistor thermal rise due to self-heating at turn-on. The RF receiver circuit may be implemented as one of a single chip device or as part of an integrated system of components for use in mobile communication systems.

7 Claims, 5 Drawing Sheets

RF POWER AMPLIFIER WITH COMPENSATED CURRENT AND GAIN FROM TURN-ON TO END OF LONG BURST

BACKGROUND OF THE INVENTION

Field of the Invention

This invention relates generally to radio frequency (RF) transceiver circuitry, and more particularly, to power amplifier architectures providing compensated current and gain from turn-on to end of long signal bursts for use in mobile communications systems.

Description of Related Art

Wireless communications systems find applications in numerous contexts involving information transfer over long and short distances alike, and there exists a wide range of modalities suited to meet the particular needs of each. Chief amongst these systems with respect to popularity and deployment is the mobile or cellular phone and WiFi.

A fundamental component of any wireless communications system is the transceiver, that is, the combined transmitter and receiver circuitry. The transceiver encodes the data to a baseband signal and modulates it with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals. Conventional transceivers typically do not generate sufficient power or have sufficient sensitivity for reliable communications standing alone. Thus, additional conditioning of the RF signal is necessary. The circuitry between the transceiver and the antenna that provide this functionality is referred to as the front end circuit, which is understood to contain a power amplifier (PA) for increased transmission power, and/or a low noise amplifier (LNA) for increased reception sensitivity. Each band or operating frequency of the communications system may have a dedicated power amplifier and low noise amplifier tuned specifically to that operating frequency. At the design and manufacturing stages of a high volume product all the wireless system blocks are tuned to operate at an optimal condition and so the system performance lags when non-ideal conditions appear. The input and output ports of a transceiver block are most commonly designed to operate with a 50 Ohm antenna impedance.

The gain of a thermally cold amplifier transistor is highest at the moment of turn-on. After turn-on, the Amplifier's gain gets reduced as the temperature of the die rises due to self-heating. During this active time period, the signal (burst) gets amplified—in this case with drooping gain over the warm-up period. This behavior results in different signal gain at the beginning than towards the end of the burst interval, thus causing problems that grow with the length of the turn-on time. For example, Linear Amplifiers are used as Power Amplifiers, Driver Amplifiers and Low Noise Amplifiers for Radio Frequency (RF) applications. The Output Power of an amplifier is Input Power times Gain. Hence, the output power of the amplifier is also drooping over the burst time. Linear Amplifiers, especially those for WiFi and other applications that rely on amplitude changes to encode digital information, are not allowed to have gain changes during signal burst as the receiver gets calibrated with a modulated pre-amble at the very beginning of each signal burst interval. For example, if a standard allows signal bursts of N*4usec with N up to 4096, the amplifier will need to handle burst times of more than 1 msec, in the extreme case up to 16,384 msec. Calibration at the beginning of the transmission causes Error Vector Magnitude (EVM) errors as the calibration loses more and more accuracy during the burst.

WiFi (802.11XX) standards typically assume that a link is temporally stationary and assume that the link budget, and therefore transmitted power, is stable over the temporal length of a burst. Early WiFi systems used only short bursts and low modulation complexity, so amplifier stability was not a problem. More recent WiFi standards, such as 802.11AC, allow for longer bursts (for improved throughput), and support 256 QAM modulation which call for better amplifier linearity to achieve the specified EVM. Under this standard, excellent amplifier performance must be maintained over a long burst interval, but as noted an amplifier's gain tends to droop as it warms up which provides an opportunity for improvement.

The present invention is focused on providing power amplifier architectures and circuits that preserve amplifier gain linearity over a long burst interval by compensating for gain droop as the amplifier warms up.

SUMMARY OF THE INVENTION

The present invention teaches certain benefits in construction and use which give rise to the objectives described below.

A primary objective of the present invention is to provide an RF amplifier architecture including transmitter power amplifier (PA) circuits having advantages not taught by the prior art. The invention addresses the problem of a Regular Amplifier's gain droop upon cold turn-on by reduction of the gain at the turn-on instant and during the initial portion of the signal burst interval. In one embodiment it uses an RC circuit to delay a mirror current derived bias voltage. In other embodiments the delay may be provided by other circuit configurations such as an operational amplifier. In yet another embodiment, the delay is part of the current mirror circuit, i.e. the voltage generated inside the mirror changes with the time constant towards the final value. The supply current Icc or Idd of the amplifier may be a multiple of the mirror current. Due to the delay, the supply current rises slowly to its final value with a time constant given by the RC or other delay circuit. This electrical time constant may be matched to the thermal time constant of the self-heating of the amplifier transistor. The gain becomes higher with higher current. It may be set equal, at the beginning of the burst, to the gain after self-heating. The initial current may be lowered below its final value as for equal currents, gain is generally higher at lower temperature. This invented measure results in a relatively constant gain over the entire burst time interval. Time constants are expected at the order of 1 msec (e.g., R could be ~10 kohms, C~100 nF). Advantageously, embodiments of systems and methods for temperature compensated power amplifier gain disclosed herein can be applied to a variety of amplifiers, such as power amplifiers, low noise amplifiers, pulse amplifiers, driver amplifiers, instrumentation amplifiers, gain blocks, or any amplifier needing excellent short-term stability.

An additional objective of the present invention is to provide constant EVM (Error Vector Magnitude) of the digital modulation.

A further additional objective of the present invention is to provide an RF receiver low noise amplifier (LNA) or other amplifier capable of having its gain adjusted to compensate for self-heating temperature variation wherein implementation of this invention has low cost and does not require individual circuit calibration after design.

Finally, the proposed solutions may be integrated into transceiver circuits that are fabricated in CMOS technology or applied as standalone devices. Other features and advantages of the present invention will become apparent from the following more detailed description, taken in conjunction with the accompanying drawings, which illustrate, by way of example, the principles of the invention.

DETAILED DESCRIPTION OF THE INVENTION

Various embodiments of an RF amplifier architecture including transmitter power amplifier (PA) circuits having advantages not taught by the prior art are described herein. In the following description, numerous specific details are set forth in order to provide a thorough understanding of the present invention. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Throughout the specification and claims, the following terms take the meanings explicitly associated herein, unless the context clearly dictates otherwise. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly coupled by way of a metal line, or indirectly connected by way of an intervening circuit element (e.g., a capacitor, resistor, or by way of the source/drain terminals of a transistor). The term "circuit" means either a single component or a multiplicity of components, either active or passive, that are coupled together to provide a desired function. The term "signal" means at least one current, voltage, or data signal. Although circuit elements may be fabricated on the back side, when reference is made to certain circuit elements residing within or formed in a substrate, this is generally accepted to mean the circuits reside on the front side of the substrate.

The above-described drawing figures illustrate the invention, an RF amplifier architecture providing constant gain and improved linearity during a signal burst interval in the face of amplifier temperature increase at the turn-on instant of the interval.

Figure 1:
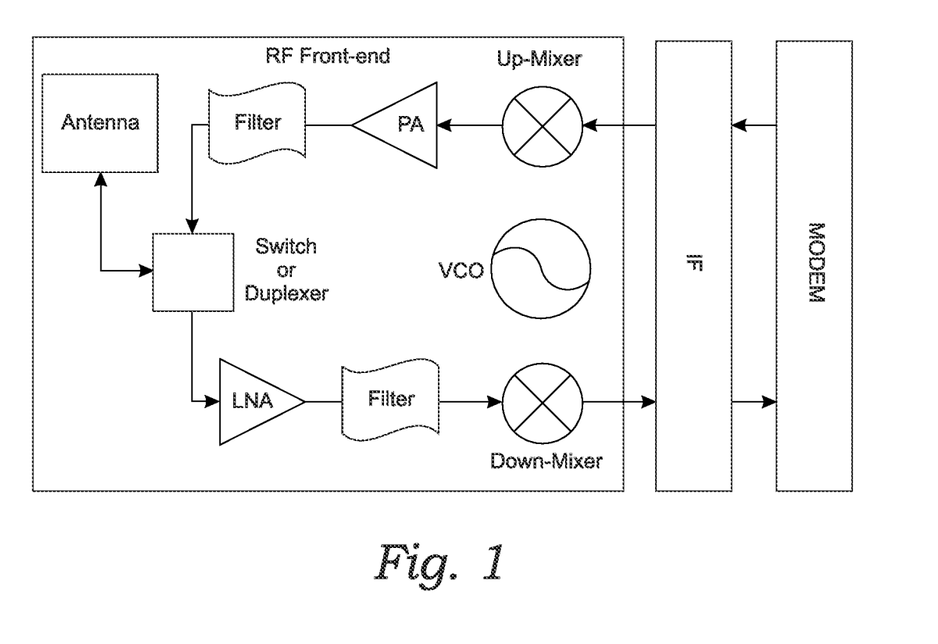
FIG. 1 is a diagram illustrating the circuit blocks found in a typical RF transceiver architecture.

FIG. 1 is a diagram illustrating the circuit blocks found in a typical RF transceiver architecture or RF front end. With a Duplexer or switch in a receive mode an RF signal is received at an antenna and picked up by a low noise amplifier LNA and sent on to receiver components such as a filter, down-mixer, IF block, and modem. With the Duplexer or switch in transmit mode the antenna receives forward power Pf from a power amplifier PA through a filter and radiates power Prad into space. Also shown in FIG. 1 are a voltage-controlled oscillator VCO and an Up-Mixer and a Down-Mixer which are used to up convert and down convert an input RF frequency to an intermediate frequency IF.

Figure 2:
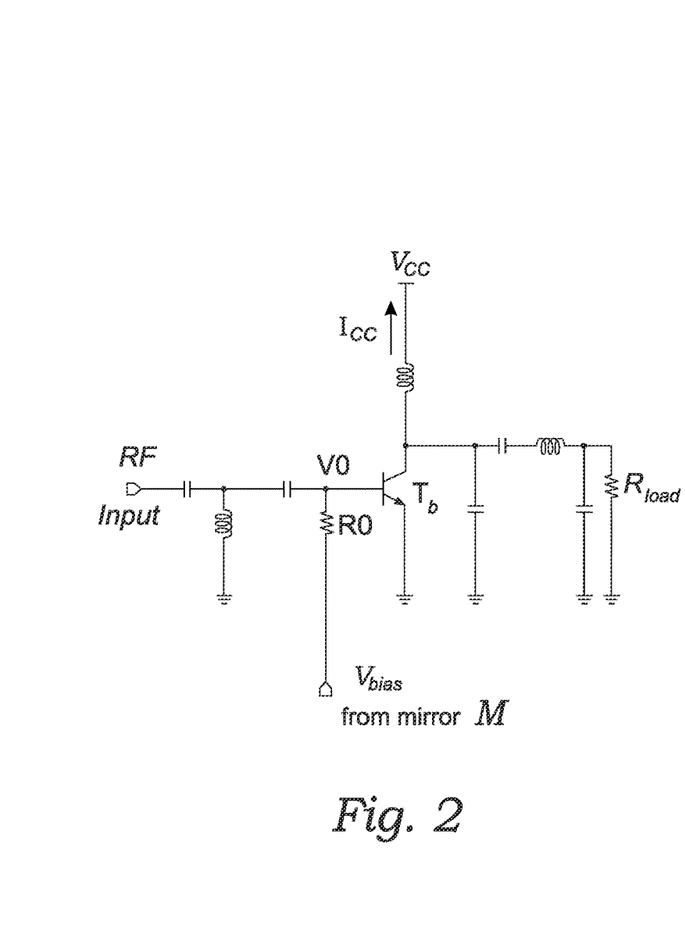
FIG. 2 is an electrical schematic diagram illustrating a Regular Amplifier according to the prior art.

FIG. 2 is an electrical schematic diagram illustrating an example of a Regular RF Amplifier according to the prior art. The illustrated amplifier example incorporates a Bipolar transistor Tb with voltage V0 applied to its base. Voltage V0 is derived from a bias voltage Vbias provided by a mirror current circuit M that is coupled through a resistor R0 to the base electrode. RF amplifiers that include bipolar transistors can also include a current mirror bias circuit which is a circuit designed to copy a current through one active device by controlling the current through another active device, keeping the output current constant regardless of loading. A mirror current circuit M may be employed in various embodiments of the present invention and they may be any of those known to those skilled in the art. A supply voltage at Vcc powers the transistor, and a supply current Icc is one main characteristic of the circuit along with Gain and Power. A load resistance $R_{load}$ is typically 50 Ohms.

Figure 3:
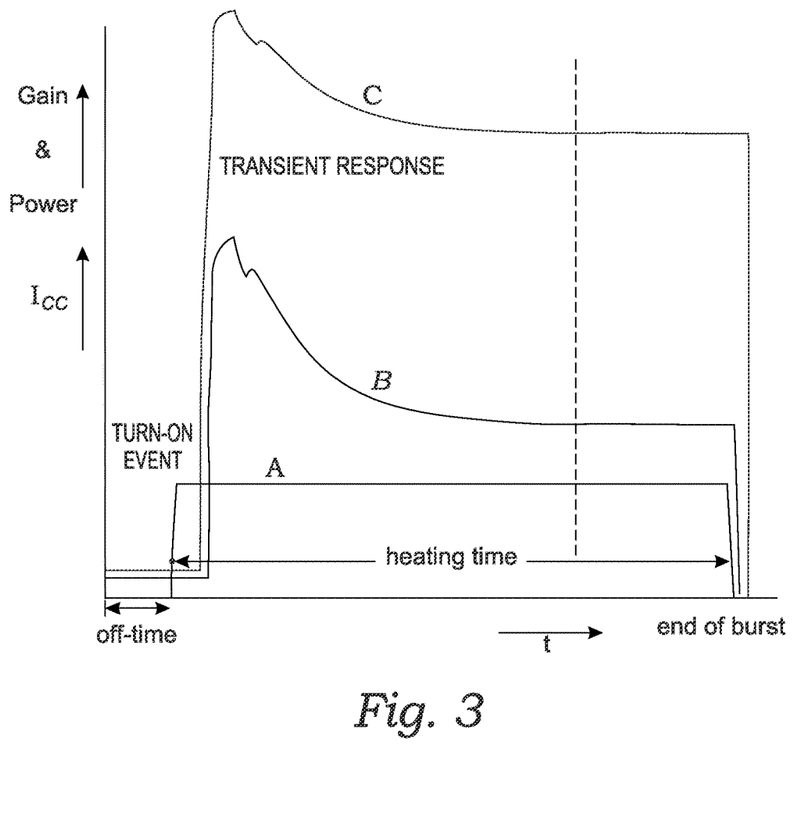
FIG. 3 is an illustration of the transient current and gain of a Regular Amplifier according to the prior art.

FIG. 3 is an illustration of the time dependent supply current Icc, Gain and Power characteristics of the prior art Regular RF Amplifier shown in FIG. 2. Along the horizontal axis is shown the time t with trace A illustrating a signal burst interval from its off-time turn-on event to the end of the burst interval. The transistor typically heats up beginning at the turn-on event and stabilizing near the end of the burst. FIG. 3 also illustrates the amplifier supply current Icc transient characteristic with trace B wherein the Icc quickly rises at the turn-on event well above the value it settles to by the end of the burst interval. This characteristic is primarily a result of the initial self-heating within the amplifier transistor at the turn-on event. FIG. 3 additionally illustrates the amplifier Gain and Power transient characteristic with trace C wherein the Gain and Power quickly rise at the turn-on event well above the value they settle to by the end of the burst interval. This droop characteristic is primarily a result of the initial self-heating within the amplifier transistor during the signal burst interval that follows the turn-on event.

Figure 4:
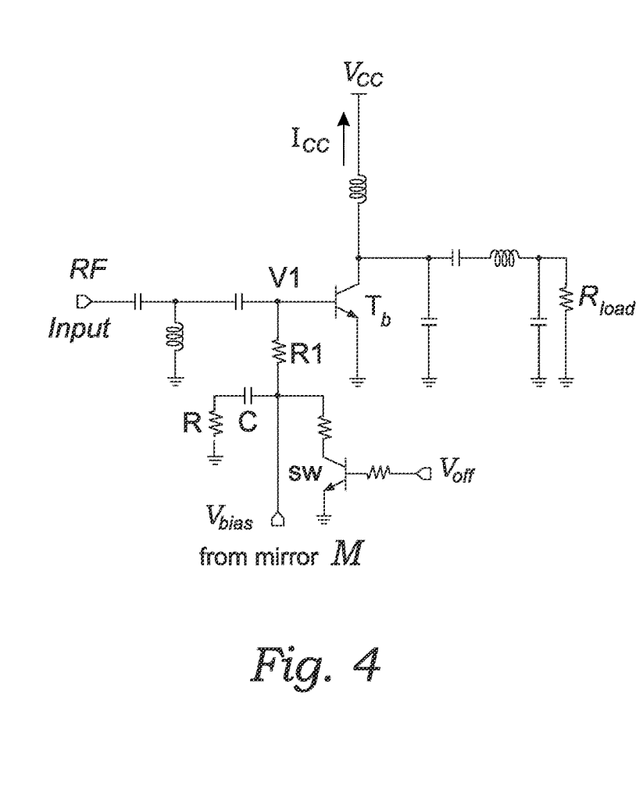
FIG. 4 is an electrical schematic diagram illustrating a Regular Amplifier according to an embodiment of the invention.

FIG. 4 is an electrical schematic diagram illustrating an example of a Regular RF Amplifier according to a first embodiment of the invention. The illustrated amplifier example incorporates a Bipolar transistor Tb with voltage V1 applied to its base electrode. Voltage V1 is derived in part from a bias voltage Vbias provided by a mirror current circuit M that is coupled through a resistor R1 to the base electrode. A supply voltage at Vcc powers the transistor, and a supply current Icc is one main characteristic of the circuit along with Gain and Power. A load resistance $R_{load}$ is typically 50 Ohms. The inventive elements include the addition of an RC circuit comprising capacitor C and resistor R which are connected between ground and to Vbias at a point prior to resistor R1 which functions to delay the application of the mirror current to the base electrode of transistor Tb. Due to the delay the current at the base electrode rises slowly to its final value with an electrical time constant given by the RC circuit. The electrical time constant must be matched to the rising thermal time constant of the amplifier transistor as it heats up during a turn-on event. As illustrated in FIG. 3 the Gain and Power of the prior art amplifier quickly rise at the turn-on event well above the value they settle to by the end of the burst. Given that the transistor circuit Gain, Power and Icc rise as the transistor heats up, the invented device design sets the gain at the instant of turn-on to be equal to the gain realized following the self-heating event when the thermal transient has normalized. The invented amplifier circuit results in a relatively constant gain over the entire burst interval and thereby provides constant EVM of the digital modulation. The time constants of the RC circuit may be on the order of 1 millisecond. So, for example, R may be approximately 10 k Ohms and C may be approximately 100 nF. An alternate amplifier circuit design that may reduce the required value of capacitor C is to use an active circuit such as an Operational Amplifier with a RC time delay.

FIG. 4 also illustrates that, since the delay introduced by the RC circuit also applies to the turn-off time, a switch transistor SW may be connected between the connection point of capacitor C and resistor R1 and ground. Switch transistor SW is activated by Voff in order to discharge capacitor C at the end of the burst interval. Voff can be supplied by any point of the circuitry associated with turning off the amplifier's current. This invented amplifier circuit is realized at low cost with low utilization of associated space on an integrated circuit and once designed for a given amplifier application requires no calibration.

Figure 5:
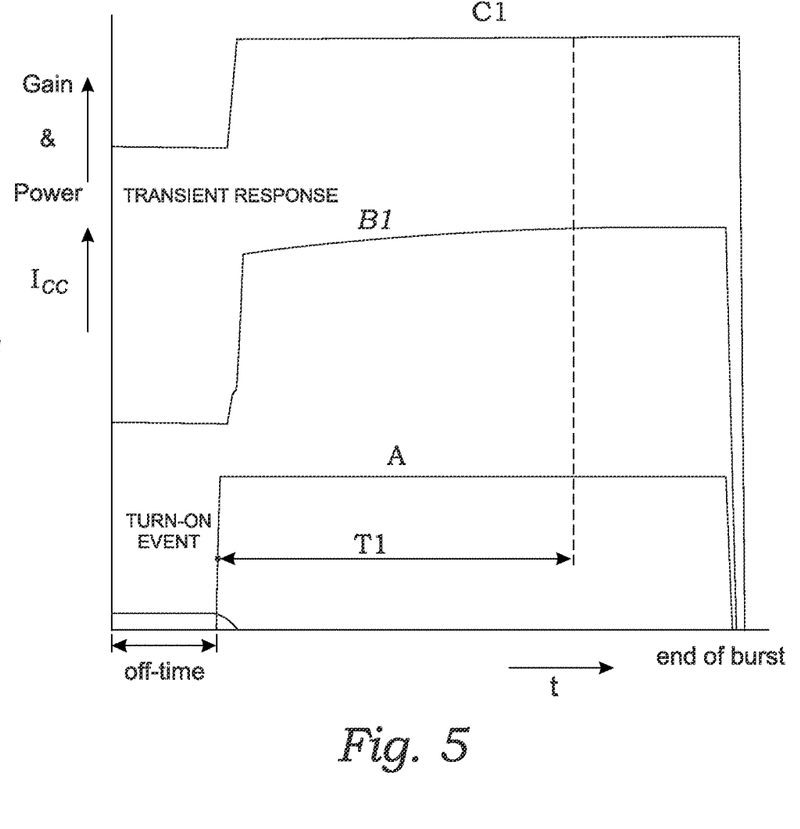
FIG. 5 is an illustration of the transient current and gain of a Regular Amplifier according to an embodiment of the invention.

FIG. 5 is an illustration of the time dependent supply current Icc, Gain and Power characteristics of the invented Regular RF Amplifier shown in FIG. 4. The figure description is similar to that of FIG. 3. Along the horizontal axis is shown the time t with trace A illustrating a signal burst interval from its off-time turn-on event to the end of the burst. But unlike FIG. 3 the amplifier supply current Icc transient characteristic B1 begins slightly lower than its eventual stable value at time T1, which is the time required to reach stable current. Also unlike FIG. 3 the amplifier supply Gain and Power transient characteristic C1 will follow the supply current profile and may be slightly higher or lower at the beginning of the burst than its value at time T1, which is the time required to reach stable current and gain. The time duration from turn-on event to time T1 may usually be less than the time duration of the burst interval. Also, unlike the prior art illustrated in FIG. 3, the amplifier supply current and thus the gain slowly reaches the target value with a time constant determined by the values of resistor R and capacitor C.

Figure 6:
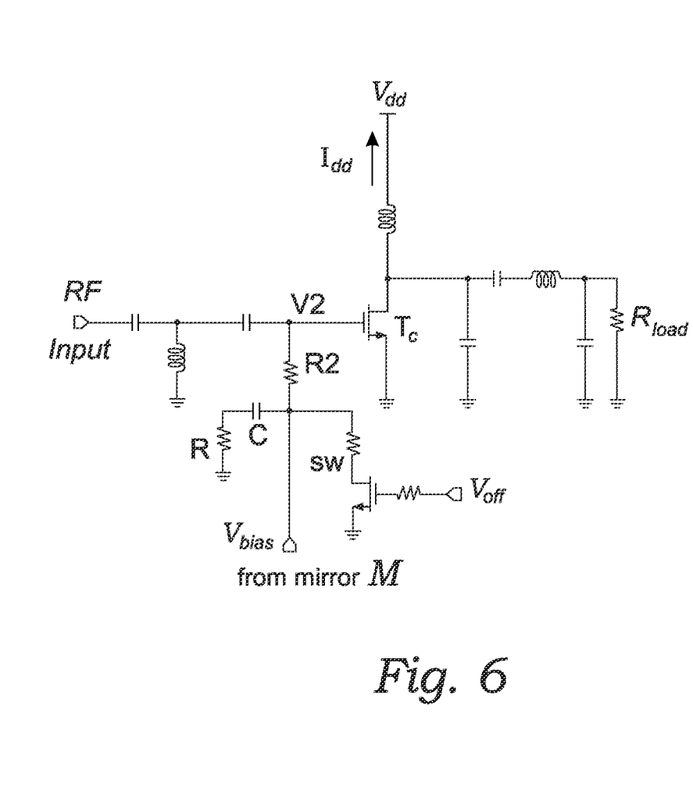
FIG. 6 is an electrical schematic diagram illustrating a Regular Amplifier according to another embodiment of the invention.

FIG. 6 is an electrical schematic diagram illustrating an example of a Regular RF Amplifier according to a second embodiment of the invention. The illustrated amplifier example incorporates a Complementary Metal Oxide Semiconductor CMOS transistor Tc with voltage V2 applied to its gate electrode in place of the Bipolar transistor Tb illustrated in FIG. 4. Voltage V2 is derived in part from a bias voltage Vbias provided by a mirror current circuit M that is coupled through a resistor R2 to the gate electrode. As with the first embodiment the inventive elements include the addition of an RC circuit comprising capacitor C and resistor R, which are connected between ground and Vbias at a point prior to resistor R2, which functions to delay the application of the mirror current to the gate electrode of transistor Tc. A supply voltage at Vdd powers the transistor, and a supply current Idd is one main characteristic of the circuit. A load resistance Rload is typically 50 Ohms. The performance characteristics related to the second embodiment of the invention are the same as those illustrated in FIG. 5 except that supply current Icc is replaced by supply current Idd. The detailed description is not repeated as it is obvious to those skilled in the art.

FIG. 6 also illustrates that, since the delay introduced by the RC circuit also applies to the turn-off time, a switch transistor SW may be connected between the connection point of capacitor C and resistor R2 and ground. Switch transistor SW is activated by Voff in order to discharge capacitor C at the end of the burst interval. Voff can be supplied by any point of the circuitry associated with turning off the amplifier's current. This invented amplifier circuit is realized at low cost with low utilization of associated space on an integrated circuit and once designed for a given amplifier application requires no further calibration.

Figure 7:
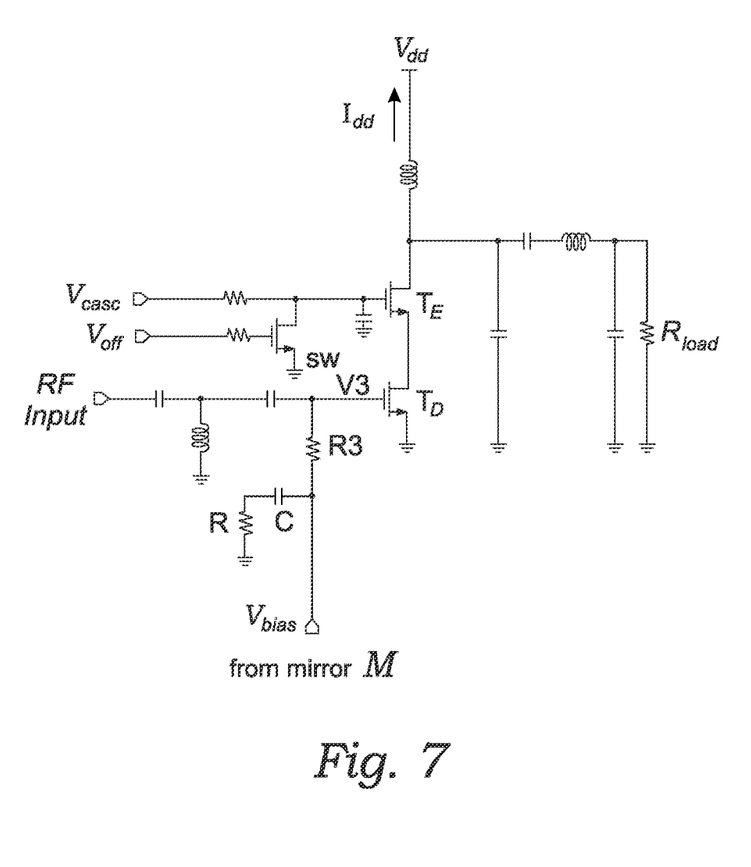
FIG. 7 is an electrical schematic diagram illustrating a Regular Amplifier according to another embodiment of the invention.

FIG. 7 is an electrical schematic diagram illustrating an example of a Regular RF Amplifier according to a third embodiment of the invention. The illustrated amplifier example incorporates a CMOS Cascode amplifier with the output of transistor Td, the common source amplifying transistor, fed to the common gate stage transistor Te. Voltage V3 is applied to the gate electrode of transistor Td. Voltage V3 is derived in part from a bias voltage Vbias provided by a mirror current circuit M that is coupled through a resistor R3 to the gate electrode of transistor Td. Voltage Vcasc is applied to the gate electrode of transistor Te. As with the first embodiment the inventive elements include the addition of an RC circuit comprising capacitor C and resistor R which are connected between ground and Vbias at a point prior to resistor R3 which functions to delay the application of the mirror current to the gate electrode of transistor Tc. A supply voltage at Vdd powers the transistor, and a supply current Idd is one main characteristic of the circuit. A load resistance $R_{load}$ is typically 50 Ohms. The incorporation of the Cascode amplifier components provides high intrinsic gain, high output impedance and large bandwidth to applications benefiting from it. The performance characteristics related to the third embodiment of the invention are the same as those illustrated in FIG. 5 except that supply current Icc is replaced by supply current Idd. The detailed description is not repeated as it is obvious to those skilled in the art. Other embodiments of the present invention are obtained by adding further CMOS transistors on top of a cascode.

FIG. 7 also illustrates that, since the delay introduced by the RC circuit also applies to the turn-off time, a switch transistor SW may be connected between the gate electrode of transistor Te and ground. Switch transistor SW is activated by Voff in order to turn off transistor Te at the end of the burst interval. Voff can be supplied by any point of the circuitry associated with turning off the amplifier's current. This invented amplifier circuit is realized at low cost with low utilization of associated space on an integrated circuit and once designed for a given amplifier application requires no calibration.

Figure 8:
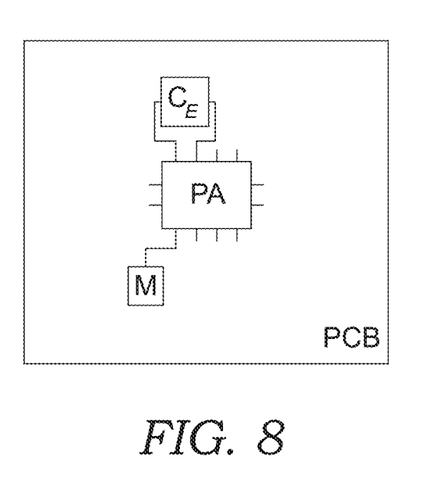
FIG. 8 is an electrical schematic diagram illustrating a Regular RF Amplifier according to an embodiment of the invention.

FIG. 8 is an electrical schematic diagram illustrating an example of a Regular RF Amplifier according to an embodiment of the invention. Power amplifier PA may be an integrated circuit contained within an integrated circuit package wherein the integrated circuit package has external pins to connect it to printed circuit board PCB. External components such as a capacitor may be connected to the external pins. A capacitor connected to a package pin may be called an external capacitor. External capacitor is a known term of art. An example external capacitor CE is shown in FIG. 8. In a resistor-capacitor network the required capacitor value may be too large to be fabricated internal to an integrated circuit whereas the required resistor value may be easily fabricated internal to an integrated circuit. Also shown in FIG. 8 is current mirror circuit M which may be connected to another external pin or may reside inside integrated circuit package PA.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. Directional terminology such as "top", "down", "above", "below" are used with reference to the orientation of the figure(s) being described. Also, the terms "have," "include," "contain," and similar terms are defined to mean "comprising" unless specifically stated otherwise. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

The above description of illustrated examples of the present invention, including what is described in the Abstract, are not intended to be exhaustive or to be limited to the precise forms disclosed. While specific embodiments of, and examples for, the invention are described herein for illustrative purposes, various equivalent modifications are possible without departing from the broader spirit and scope of the present invention. Indeed, it is appreciated that the specific example structures and materials are provided for explanation purposes and that other structures and materials may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. A radio frequency (RF) power amplifier architecture and circuits comprising an integrated circuit for adjusting power amplifier output gain during a signal burst interval, comprising:

an amplifier transistor controlling and providing gain to an output current flowing between a voltage supply coupled to the transistor's output terminal and ground;

a first circuit comprising a current mirror circuit providing a bias voltage at a first terminal which is coupled through a resistor to an input terminal of the amplifier transistor; and a second circuit connected to the current mirror circuit at the first terminal providing a signal to modify the bias voltage following a turn-on portion of the signal burst interval, wherein the second circuit comprises a resistor-capacitor network, and wherein the capacitor in the resistor-capacitor network is a capacitor that is connected to external pins of the package of the integrated circuit; and wherein the second circuit causes amplifier transistor output gain to slowly rise to a design target value over a time interval characterized by a time constant, wherein the electrical time constant of the resistor-capacitor network matches a thermal time constant of the amplifier transistor; and wherein the combined first and second circuits reduce amplifier transistor output gain following the turn-on portion of the signal burst interval by increasing the bias voltage on the amplifier transistor to compensate for a decrease in amplifier transistor gain due to thermal self-heating in the amplifier transistor following the turn-on portion of the signal burst interval and thereby provide uniform gain throughout the signal burst interval.

2. The RF power amplifier architecture and circuits of claim 1, wherein the second circuit also comprises an internal capacitor with one electrode connected to the first terminal and a resistor connected between a second electrode of the capacitor and ground.

3. The RF power amplifier architecture and circuits of claim 1, further comprising a switch transistor to turn off the amplifier transistor at the end of the burst signal interval by providing a discharge capability to the resistor-capacitor network.

4. The RF power amplifier architecture and circuits of claim 1, wherein the combined first and second circuits reduce amplifier gain following the turn-on portion of the signal burst to compensate for decrease in amplifier gain due to thermal heating in the amplifier transistor following the turn-on event and thereby provide uniform Error Vector Magnitude of a digital modulation throughout the signal burst interval.

5. A radio frequency (RF) power amplifier architecture and circuits for adjusting power amplifier output gain during a signal burst interval comprising:

an RF Cascode amplifier comprising a common gate stage transistor and a common source RF amplifying transistor for providing RF gain to an RF output current flowing between a voltage supply that is coupled to the common gate stage transistor output terminal through the common source RF amplifying transistor to ground;

a first circuit comprising a current mirror circuit providing a bias voltage at a first terminal which is coupled through a resistor to the input terminal of the common source amplifying transistor; and a second circuit connected to the current mirror circuit at the first terminal providing a signal to modify the bias voltage on the common source RF amplifying transistor of the RF Cascode amplifier following a turn-on portion of the signal burst interval, wherein the second circuit comprises a resistor-capacitor network, and wherein a capacitor is a capacitor that is connected to the external pins of the package of the integrated circuit, and wherein the second circuit causes common source RF amplifying transistor output gain to slowly rise to a design target over a time interval characterized by a time constant, wherein the electrical time constant of the resistor-capacitor network matches a thermal time constant of the common source RF amplifying transistor, and wherein the combined first and second circuits reduce common source RF amplifying transistor output gain following the turn-on portion on the signal burst interval by increasing the bias voltage on the common source RF amplifying transistor to compensate for a decrease in the common source RF amplifying transistor gain due to thermal self-heating in the common source RF amplifying transistor following the turn-on portion of the signal burst interval and thereby provide uniform gain throughout the signal burst interval.

6. The RF power amplifier architecture and circuits of claim 5, further comprising a third circuit providing a switch between the gate electrode of the common gate stage transistor and ground to turn off the common gate stage of the RF Cascode amplifier at the end of the burst signal interval by providing a discharge capability to the resistor-capacitor network.

7. A radio frequency (RF) power amplifier architecture and circuits for adjusting power amplifier output gain during a signal burst interval, comprising:

an amplifier transistor controlling and providing gain to an output current flowing between a voltage supply coupled to the amplifier transistor's output terminal and ground; and a first circuit comprising a current mirror circuit providing a bias voltage at a first terminal which is coupled through a resistor to an input terminal of the amplifier transistor; and a second circuit, comprising a resistor-capacitor network, connected between the current mirror circuit at the first terminal and ground providing a signal to modify the bias voltage following a turn-on portion of the signal burst interval; and a third circuit, comprising a switch to ground, to turn off the amplifier transistor at the end of the burst signal interval by providing a discharge capability to the resistor-capacitor network, wherein the combined first and second circuits reduce amplifier transistor gain following the turn-on portion of the signal burst interval to compensate for decrease in amplifier transistor gain due to thermal self-heating in the amplifier transistor following the turn-on portion of the signal burst and thereby provide uniform gain and uniform Error Vector Magnitude of a digital modulation throughout the signal burst interval.

* * * * *